(12) United States Patent
Fukuhara et al.

(10) Patent No.: US 8,005,355 B2
(45) Date of Patent: Aug. 23, 2011

(54) CAMERA UNIT

(75) Inventors: Masaaki Fukuhara, Mito (JP); Norio Koike, Hitachiomiya (JP)

(73) Assignee: Hitachi, Ltd., Tokyo (JP)

( * ) Notice: Subject to any disclaimer, the term of this patent is extended or adjusted under 35 U.S.C. 154(b) by 16 days.

(21) Appl. No.: 12/429,719

(22) Filed: Apr. 24, 2009

(65) Prior Publication Data

US 2009/0269050 A1    Oct. 29, 2009

(30) Foreign Application Priority Data

Apr. 25, 2008  (JP) ................................. 2008-114761

(51) Int. Cl.
*G03B 17/28* (2006.01)
*H04N 5/335* (2006.01)

(52) U.S. Cl. ........................................ 396/542; 348/340

(58) Field of Classification Search .................. 348/340; 174/138 G; 438/117; 396/529, 542
See application file for complete search history.

(56) References Cited

U.S. PATENT DOCUMENTS

| | | | | |
|---|---|---|---|---|
| 4,211,890 A * | 7/1980 | Sado et al. | ..................... | 174/254 |
| 5,581,032 A * | 12/1996 | Uemura et al. | .................. | 73/493 |
| 5,685,682 A * | 11/1997 | Glime et al. | ................... | 411/510 |
| 6,399,888 B1 * | 6/2002 | Chen | .......................... | 174/138 G |
| 6,594,155 B2 * | 7/2003 | Kuroda | ......................... | 361/807 |
| 7,180,546 B2 * | 2/2007 | Kobayashi | ..................... | 348/374 |
| 7,277,242 B1 * | 10/2007 | Wang et al. | ................... | 359/808 |
| 7,388,616 B2 * | 6/2008 | Yamazaki | ..................... | 348/373 |
| 2003/0218685 A1 * | 11/2003 | Kawai | ........................... | 348/340 |
| 2005/0219399 A1 * | 10/2005 | Sato et al. | ..................... | 348/340 |
| 2005/0279916 A1 | 12/2005 | Kang et al. | | |
| 2008/0008468 A1 * | 1/2008 | Ma | ................................ | 396/529 |
| 2008/0247613 A1 * | 10/2008 | Chang | ........................... | 382/124 |

FOREIGN PATENT DOCUMENTS

| | | |
|---|---|---|
| EP | 1 220 324 A2 | 7/2002 |
| JP | 63-316572 A | 12/1988 |
| JP | 11-191865 A | 7/1999 |
| JP | 2000-69336 A | 3/2000 |
| JP | 2002-9264 A | 1/2002 |
| JP | 2006-94444 A | 4/2006 |
| JP | 2008130681 A * | 6/2008 |

OTHER PUBLICATIONS

European Search Report dated Aug. 10, 2009 (three (3) pages).

* cited by examiner

*Primary Examiner* — Clayton E LaBalle
*Assistant Examiner* — Leon W Rhodes
(74) *Attorney, Agent, or Firm* — Crowell & Moring LLP

(57) ABSTRACT

In a camera unit having a lens and an imaging device, the imaging device is fixed by means of a base plate, an elastic material, and a printed circuit board. The imaging device abuts on a first plane of the base plate, and the elastic material is sandwiched between the printed circuit board and a second plane opposite to the first plane of the base plate.

7 Claims, 4 Drawing Sheets

CAMERA UNIT

BACKGROUND OF THE INVENTION

1. Field of the Invention

The present invention relates to image recognition systems typified by in-car cameras.

2. Background Art

Retention structures of imaging devices built into imaging apparatuses such as video cameras are typically obtained by bonding with an adhesive. Specifically, an imaging device is fixedly attached to a board serving as a positioning reference for assembly, in a constant relative position. After the board is inserted into and positioned within a camera housing, it is fastened with screws and the like and retained therein. For fixation of such an imaging device, a technique using an adhesive is known (see Reference 1: JP Patent Publication (Kokai) No. 2006-094444 A). There have also been proposed methods of determining the position of an imaging device with high accuracy while reducing the number of component parts of an imaging recognition system. For example, there is known a technique of mounting a semiconductor chip of an imaging device on an attachment board and determining the position of the main body of the imaging device with a positioning means provided on the attachment board (see Reference 2: JP Patent Publication (Kokai) No. 2002-9264 A). Further, there is also known a technique of forming a package of an imaging device in an irregular shape and providing the package with notches so that such notches can be used as positioning references (see Reference 3: JP Patent Publication (Kokai) No. 63-316572 A).

SUMMARY OF THE INVENTION

However, References 1 to 3 are problematic in that in a use environment of an image processing system in which temperature fluctuation or vibration occurs, it is highly probable that the subject of image recognition would not be imaged accurately because the relative position of an imaging device and a lens could be changed due to, for example, thermal stress resulting from a difference in the coefficient of linear expansion between a structural member that abuts on the imaging device and an adhesive and between the adhesive and the imaging device, stress resulting from vibration, or peeling of the adhesive resulting from deterioration of such adhesive.

In view of the foregoing, it is an object of the present invention to provide a camera unit that can accurately image an image recognition subject even in a use environment in which temperature fluctuation or vibration occurs.

One aspect of the present invention that is desirable for solving the aforementioned problems is as follows.

In a camera unit having a lens and an imaging device, the imaging device is fixed by means of a base plate, an elastic material, and a printed circuit board.

According to the present invention, a camera unit can be provided that can accurately image an image recognition subject even in a use environment in which temperature fluctuation or vibration occurs.

Figure 1:
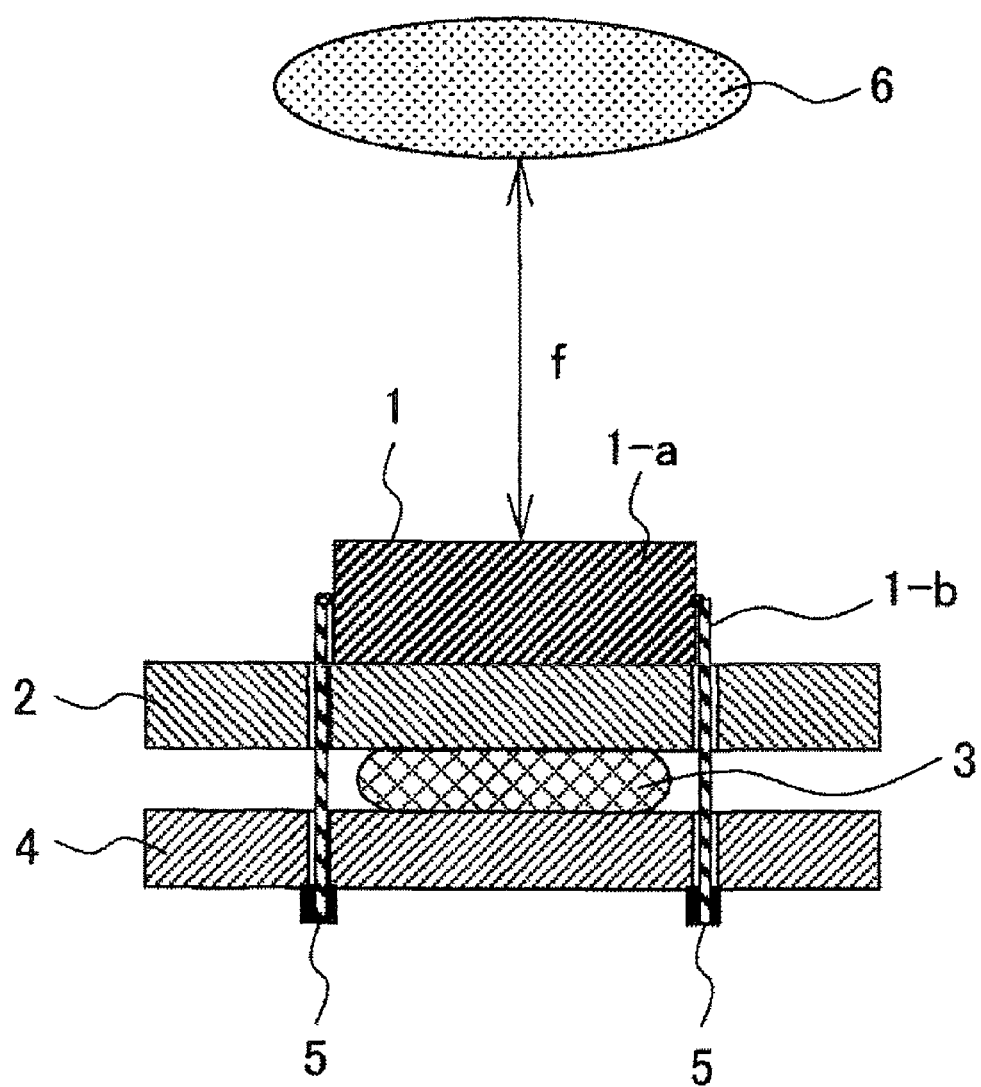
FIG. 1 illustrates the structure of a camera unit.

DESCRIPTION OF SYMBOLS 1 imaging device
1-*a* package of an imaging device
1-*b* lead of an imaging device
2 base plate
3 elastic body
4 printed circuit board
5 solder
6 lens

DETAILED DESCRIPTION OF THE PREFERRED EMBODIMENTS

Embodiments will be described below with reference to the drawings.

Embodiment 1

FIG. 1 illustrates a layout of a camera unit.

This camera unit includes an imaging device (CCD) 1, a base plate 2, an elastic material 3, a printed circuit board 4, solder 5, and a lens 6. The imaging device 1 and the lens 6 are positioned a focal length of $f$ apart from each other.

A lead 1-*b* made of metal extends from a package 1-*a* of the imaging device 1, and the imaging device 1 abuts on the base plate 2. The elastic material 3 is sandwiched between the printed circuit board and a plane on the opposite side of the base plate 2 on which the imaging element 1 abuts. As shown in FIG. 1, the imaging device 1, the base plate 2, the elastic material 3, and the printed circuit board 4 are fixed with the solder 5. With such a structure, the positions of the base plate 2 and the lens 6 can be fixed without being influenced by temperature changes. Further, the reliability of the camera unit can be improved and a more stable focus state can be provided.

Figure 2A:
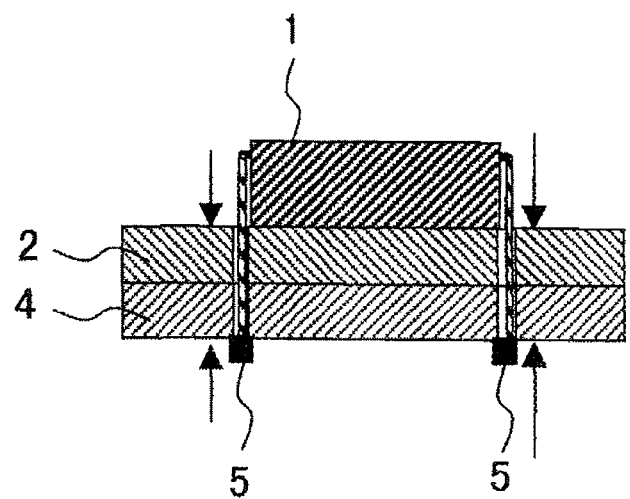
FIGS. 2A and 2B illustrate failure in a case in which no elastic body is provided.
Figure 2B:
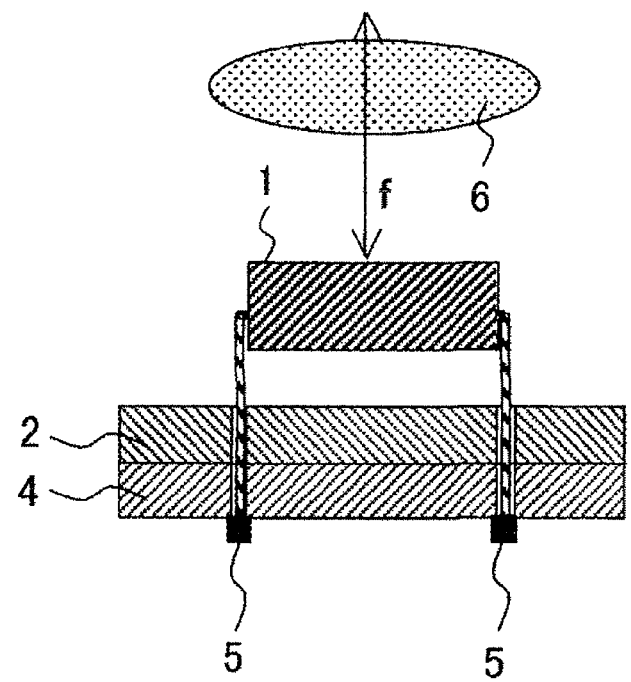

When the elastic body 3 is not provided, stress could be applied to the solder 5, resulting in failure as shown in FIG. 2A, due to expansion or shrinkage of each member resulting from a difference in the coefficient of linear expansion, or the distance between the imaging device 1 and the lens 6 could become too short as shown in FIG. 2B as a result of the imaging device 1 being located at a distance from the base plate 2, in which case an out-of-focus image would result, for example.

Considered now is a case in which aluminum (coefficient of linear expansion α: 20e-6) is used as the material of the base plate 2 and 42 ALLOY (coefficient of linear expansion α: 5e-6) is used as the material of the lead 1-*b* of the imaging device 1. In this case, the coefficient of linear expansion of the base plate 2 is four times that of the lead 1-*b* of the imaging device 1. In order to reduce adverse effect of heat, the base plate 2 and the lead 1-*b* of the imaging device 1 are desirably formed of the same material. Note that "e" is the natural logarithm.

In practice, at high temperatures, when the lead 1-*b* of the imaging device 1 expands by 10 μm, the base plate 2 will expand by 40 μm. However, such difference in expansion will absorbed by the elastic material 3.

At low temperatures, when the lead 1-*b* of the imaging device 1 shrinks by 10 μm, the base plate 2 will shrink by 40 μm. However, a gap of 30 μm generated by such shrinkage will be absorbed by the elastic material 3 pulling the imaging device 1. For the elastic material 3, a molding of silicone rubber with properties that will hardly change at either high temperatures or low temperatures, a plate spring made of a metal material, or the like can be used. With the aforementioned structures, a decrease in reliability or function resulting from thermal fluctuation can be suppressed.

Figure 3:
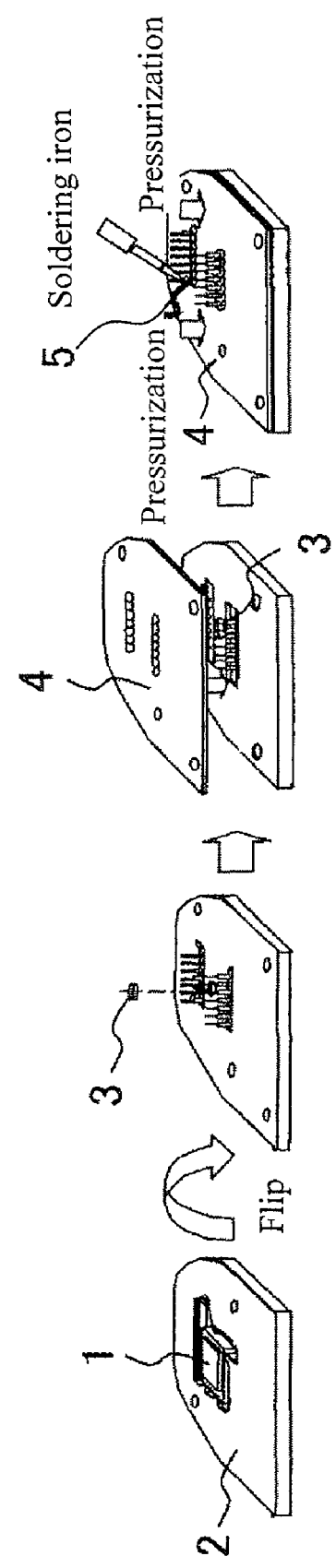
FIG. 3 illustrates a specific method of assembling a camera.

FIG. 3 illustrates a specific assembling method of the present structure.

First, the imaging device 1 is fixed on the base plate 2. The base plate 2 has a reference plane on which the position of the imaging device 1 is to be fixed. Next, the base plate 2 on which each imaging device 1 is fixed is flipped, and the elastic body 3 is mounted thereon. Next, the printed circuit board 4 is mounted such that the elastic body 3 is sandwiched between the printed circuit board 4 and the base plate 2. Then, bonding of the solder 5 is performed in a condition in which the printed circuit board 4 is pressed to a prescribed extent. The prescribed extent is determined in consideration of variations in shape, elastic modulus, compression set, and the like of the elastic body 3.

When cylindrical silicone rubber measuring 4.5 mm in diameter and 1.5 mm in height is used for the elastic body 3, the prescribed extent of compression will be 0.3 mm.

When silicone rubber or the like is used for the elastic body 3, such silicone rubber is preferably not milky translucent but is colored. When the color difference between the elastic body 3 and the base plate 2 is set to be larger than a predetermined value, failure of mounting can be avoided. Such predetermined value can be determined in any preferred way.

Figure 4A:
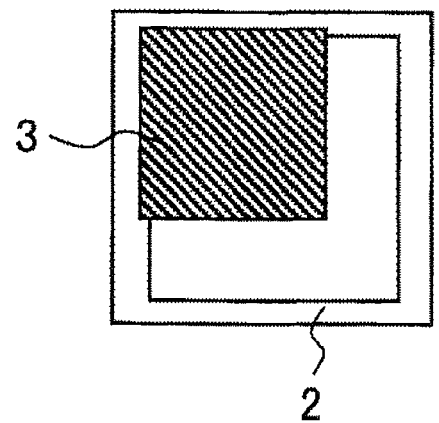
FIGS. 4A and 4B illustrate positioning portions.
Figure 4A:
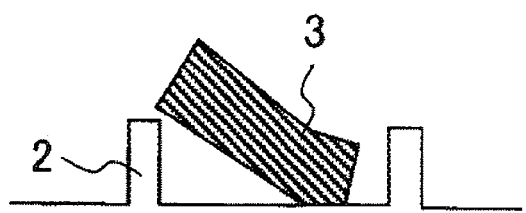
Figure 4B:
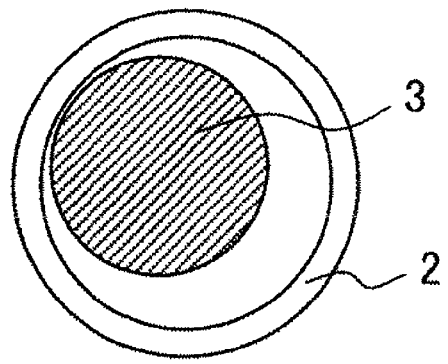
Figure 4B:
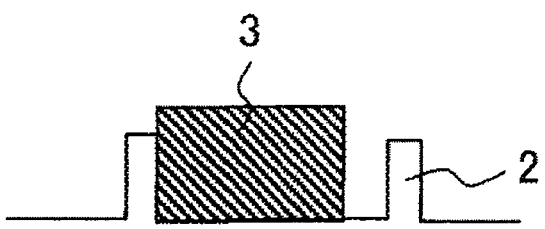

In order for the elastic body 3 to pull the imaging device 1 with stability, it is necessary that the center position of the imaging device 1 coincide with the center position of the elastic body 3. To this end, the elastic body 3 is preferably mounted after providing a recess portion in the base plate 2 to serve as a positioning portion. In such case, the shape of the recess portion is desirably cylindrical rather than rectangular so that operation failure such that the elastic body 3 becomes located upon the positioning portion as shown in FIG. 4A would be avoided.

As described above, according to the present embodiment, an elastic body is provided between a printed circuit board and a base plate, and an imaging device is configured to be constantly pressed against a reference plane provided on a structural member (i.e., the base plate) with the use of the reaction force of the elastic body, whereby it becomes possible to maintain the state of abutment of the imaging device on the structural member against expansion or shrinkage of the structural member resulting from temperature fluctuation. In addition, even when a gap is instantaneously produced at a portion at which the imaging device abuts on the reference plane due to a significant vibration or shock, the state of abutment will be automatically restored by the reaction force of the elastic body.

Further, when a structure is employed in which an outline reference plane of the imaging device is pressed against a positioning reference plane within a camera with the use of the reaction force of an elastic body, it would be possible, even when the constituent member of the reference plane within the camera is subjected to repeated stress by expansion or shrinkage resulting from thermal fluctuation or by vibration in the use environment, to maintain the imaging device in a state in which it is constantly pressed against the reference plane, to maintain the mounting position of the imaging device with high accuracy, to reduce stress on the leads of the imaging device as well as the solder portion, which could be caused by aging, and thereby to maintain a favorable state.

What is claimed is:

1. An imaging unit comprising:
   a base plate;
   an imaging device that abuts on a first side of said base plate;
   a printed circuit board; and
   an elastic material sandwiched between a first side of the printed circuit board and a second side of said base plate opposite said first side of said base plate; wherein,
   said imaging device has fixedly attached thereto a metallic lead, which penetrates the base plate and the printed circuit board;
   an end portion of said metallic lead extends through a second side of said printed circuit board, where it is fixed by soldering.

2. The imaging unit according to claim 1, further comprising a lens unit positioned at a predetermined focal length away from an exposed side or the imaging device.

3. A camera unit comprising:
   a printed circuit board;
   an imaging device having a metallic lead; and
   a lens that is positioned a predetermined focal length away from the imaging device; wherein,
   an elastic material and a base plate are disposed sequentially from a side of the printed circuit board, between the printed circuit board and the imaging device; wherein
   the imaging device abuts against a first plane of the base plate;
   the elastic material is sandwiched between a second plane of the base plate; ON a side opposite the first plane, and a first plane of the printed circuit board; and
   the metallic, lead penetrates the base plate, the space occupied by elastic material, and the printed circuit board, and has its end portion, which penetrates through to a second plane of the printed circuit board on the opposite side of the first plane, where it is fixed by soldering.

4. The camera unit according to claim 3, wherein the elastic material is silicone rubber.

5. The camera unit according to claim 4, wherein the silicone rubber is cylindrical in shape.

6. The camera unit according to claim 3, wherein the elastic material is colored, and has a color difference relative to the base plate that exceeds a predetermined value.

7. The camera unit according to claim 3, wherein the elastic material is a plate spring.

* * * * *